United States Patent [19]

Baudrand

[11] Patent Number: 4,503,131
[45] Date of Patent: Mar. 5, 1985

[54] ELECTRICAL CONTACT MATERIALS

[75] Inventor: Donald W. Baudrand, Lincolnshire, Ill.

[73] Assignee: Richardson Chemical Company, Des Plaines, Ill.

[21] Appl. No.: 340,369

[22] Filed: Jan. 18, 1982

[51] Int. Cl.³ .......................... C23C 3/02; H01H 1/02
[52] U.S. Cl. .................................. 428/672; 204/38.4; 427/58; 427/98; 427/438; 200/266; 200/268; 200/269; 428/675; 428/680; 428/926; 428/929; 428/936
[58] Field of Search .......................... 427/438, 58, 98; 428/672, 675, 680, 926, 929, 936; 200/266, 268, 269; 204/38 B

[56] References Cited

U.S. PATENT DOCUMENTS

| | | | |
|---|---|---|---|
| 3,162,512 | 12/1964 | Robinson | 428/672 |
| 4,232,060 | 11/1980 | Mallory | 427/438 |
| 4,349,585 | 9/1982 | Nagashima | 427/438 |

FOREIGN PATENT DOCUMENTS

| | | |
|---|---|---|
| 0071436 | 7/1982 | European Pat. Off. . |
| 0073583 | 8/1982 | European Pat. Off. . |
| 2807564 | 2/1978 | Fed. Rep. of Germany . |
| 2839671 | 9/1978 | Fed. Rep. of Germany . |

OTHER PUBLICATIONS

Haddad et al., "Technique . . . ", IBM Corp., 1978, IBM TDB, vol. 21, No. 6, Nov. 1978, p. 2316.

*Primary Examiner*—John D. Smith
*Attorney, Agent, or Firm*—Lockwood, Alex, Fitzgibbon & Cummings

[57] ABSTRACT

Electrical contact materials are provided which belong to the general category of copper that is overplated with a noble metal, usually gold. The improvement resides in the provision of an electroless nickel deposit laid down over the copper layer and under the gold layer, which electroless nickel deposit is laid down from a particular class of nickel-boron or nickel-phosphorus baths.

41 Claims, 15 Drawing Figures

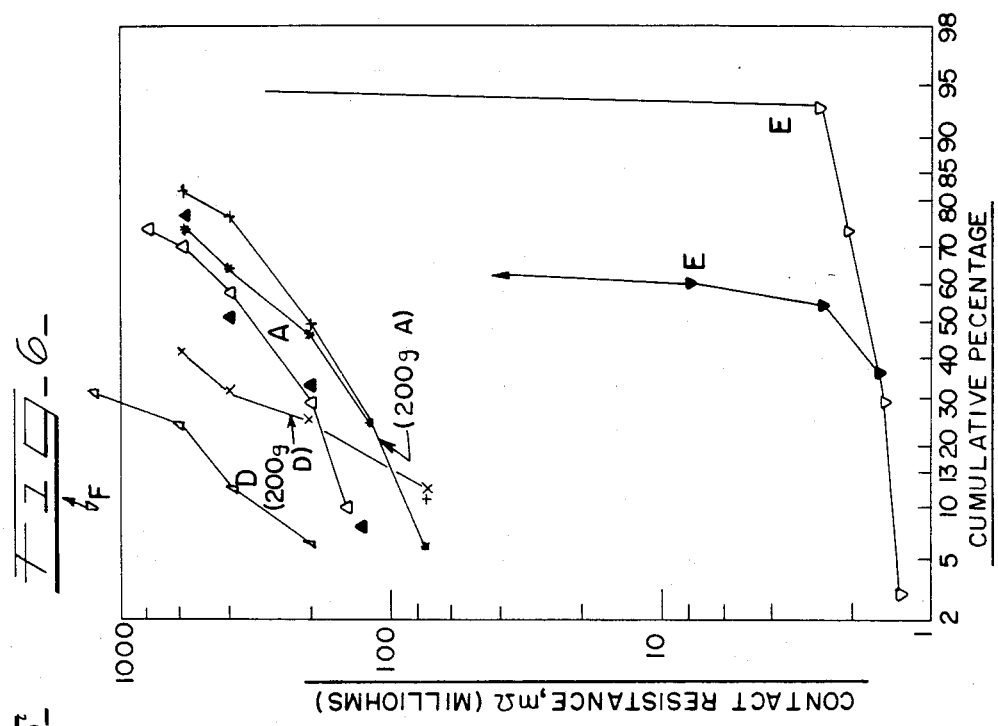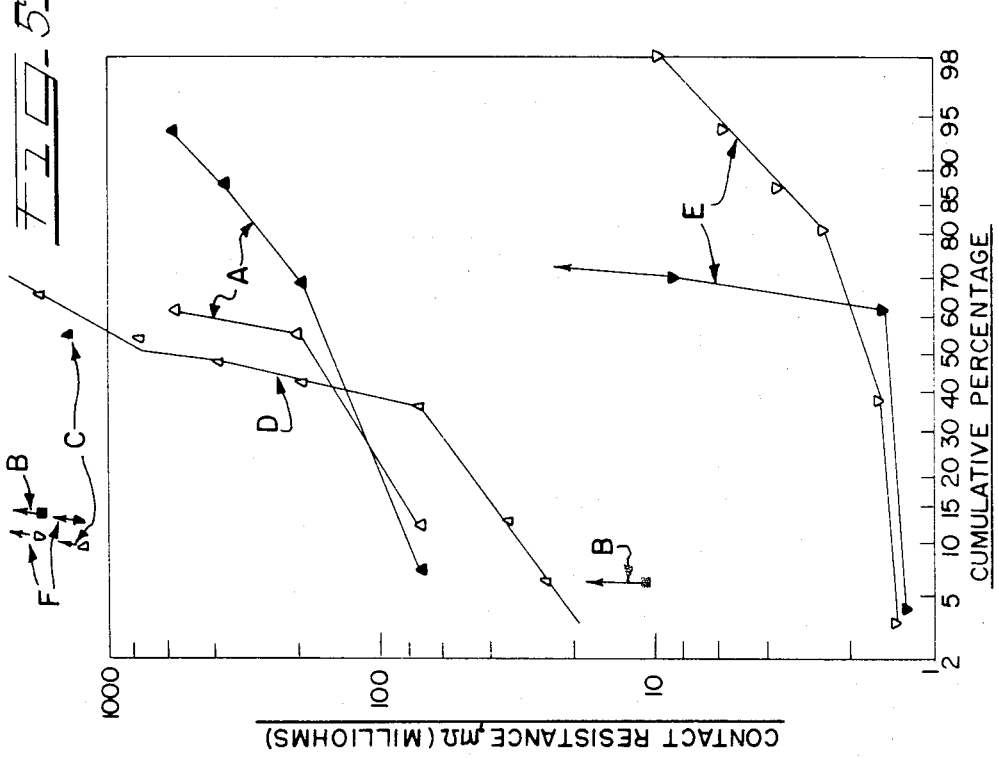

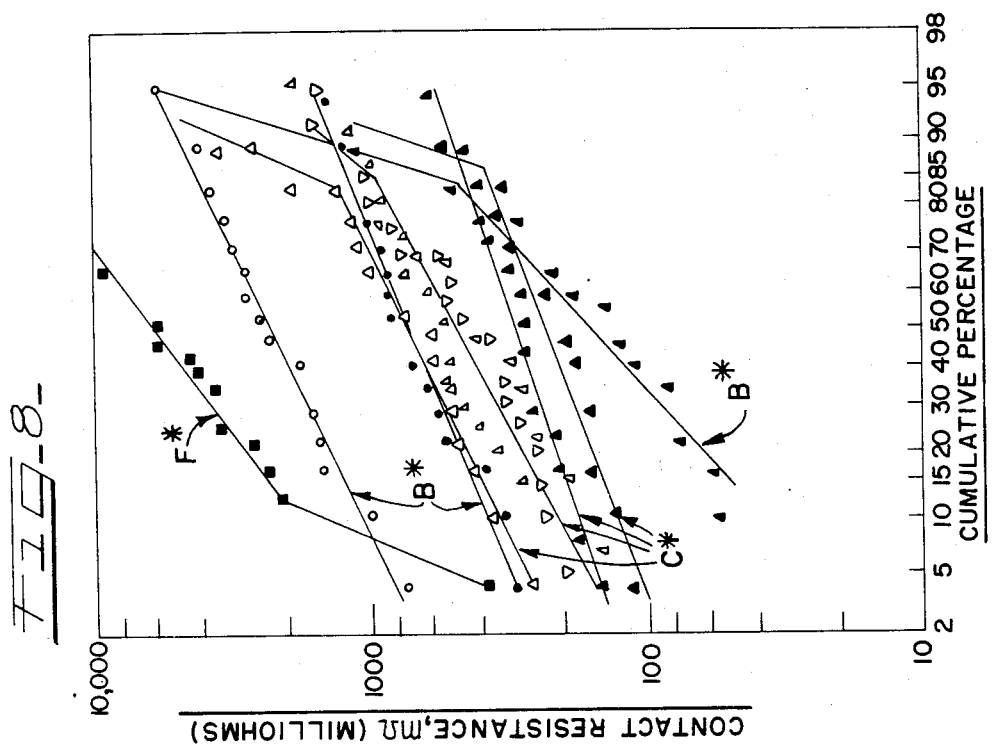
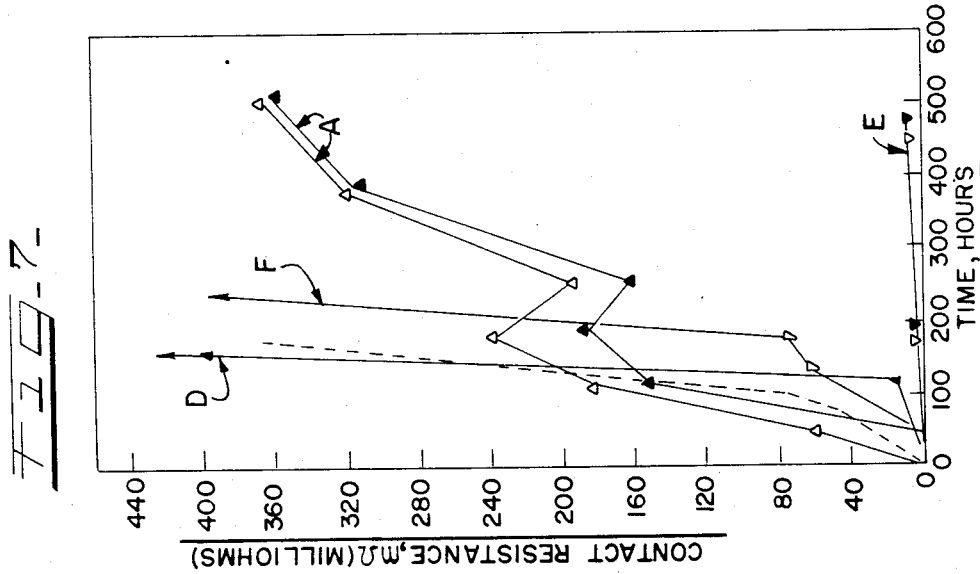

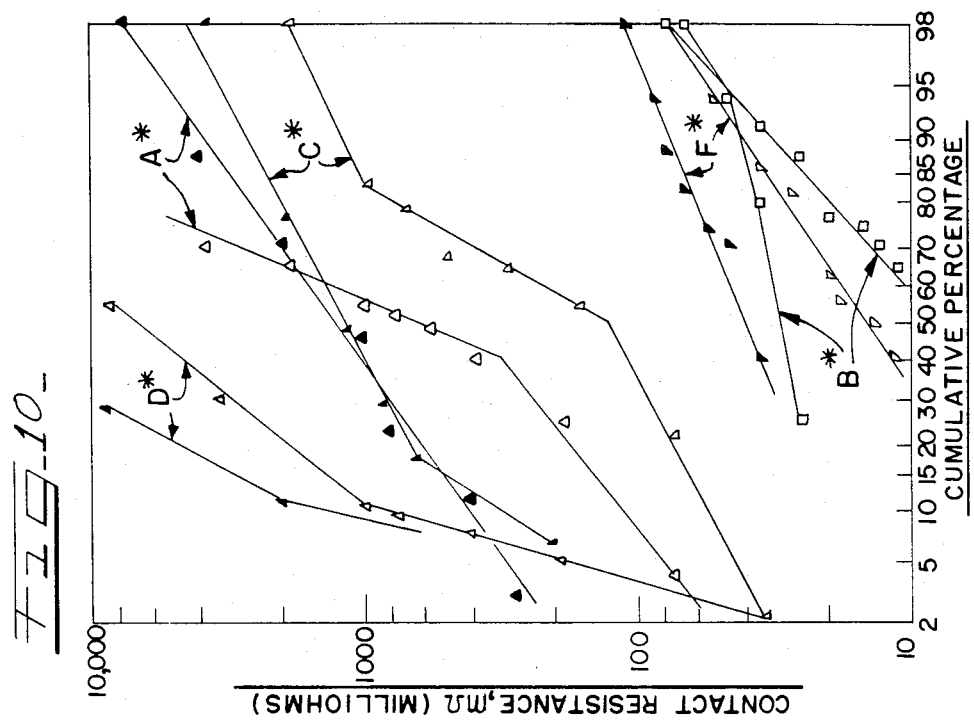
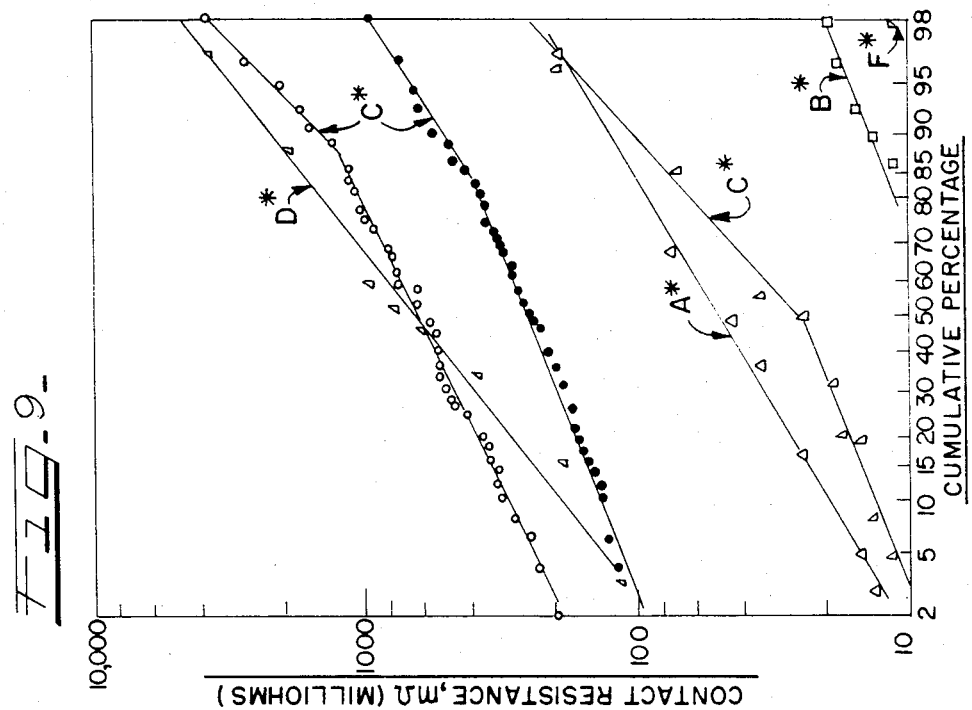

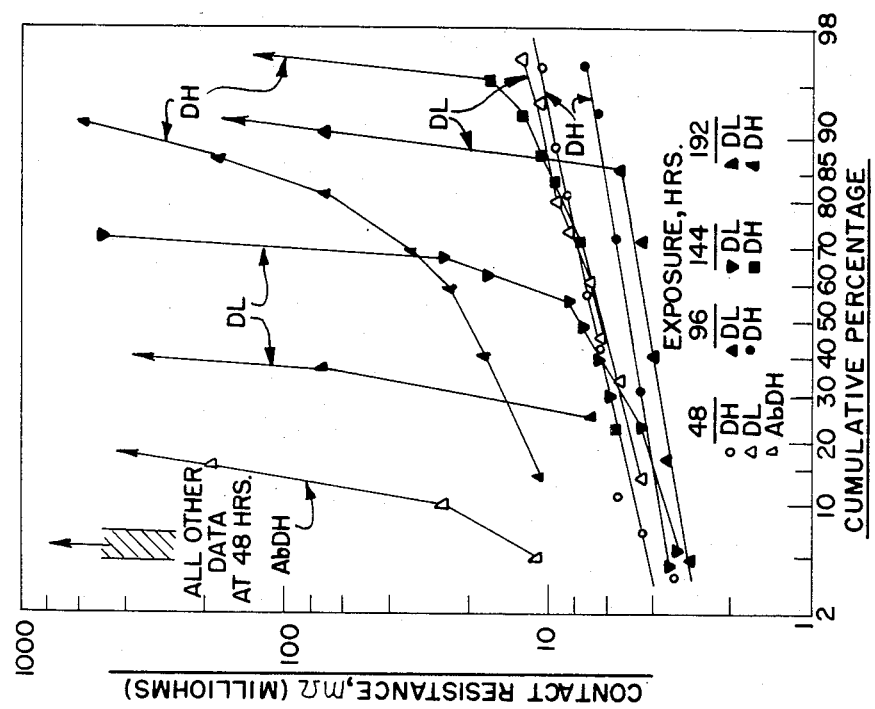
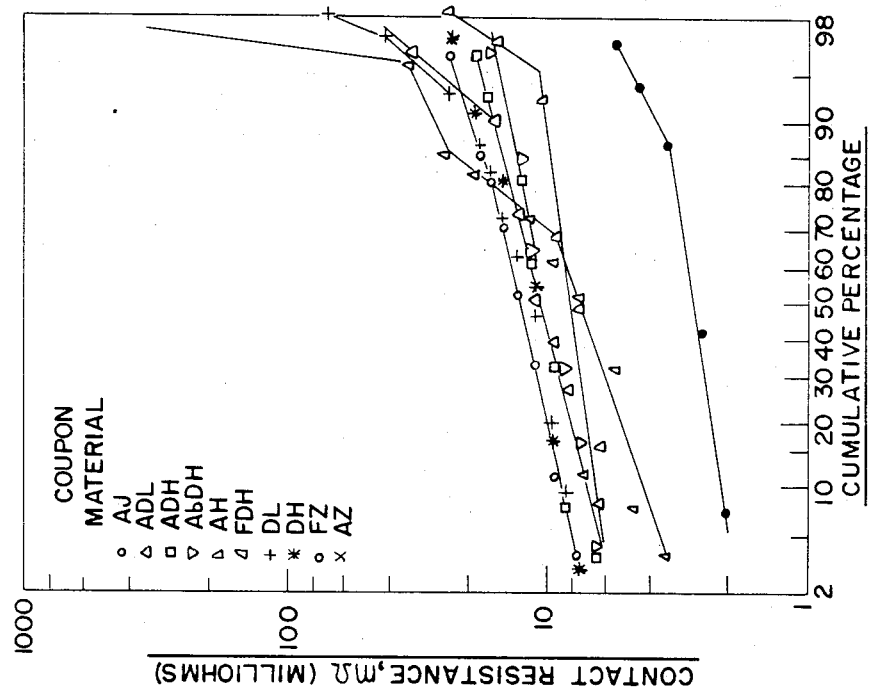

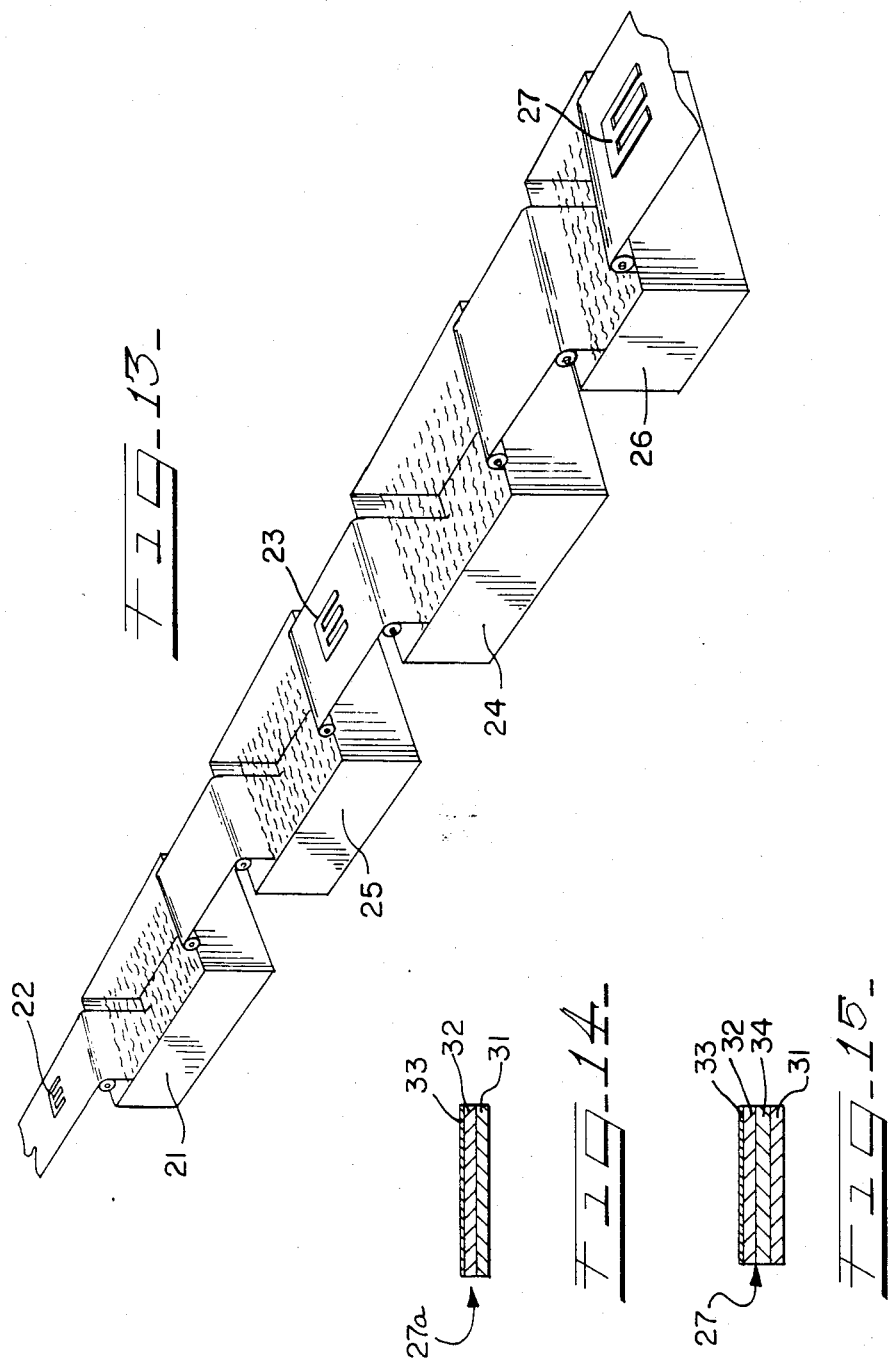

ELECTRICAL CONTACT MATERIALS

BACKGROUND AND DESCRIPTION OF THE INVENTION

This invention generally relates to electrical contact materials, more particularly to electrical contact materials having deposits that are laid down in series, the deposits being such that the electrical contact materials exhibit especially advantageous contact resistance and exceptional resistance to corrosion, while at the same time minimizing the use of gold or other noble metal.

Copper is well known and has long been used as an electrical contact material because of its very good electrical conductivity properties, although it is also well known as being subject to severe corrosion deterioration, making copper alone unsuitable for use as an electrical contact that cannot tolerate any significant build up in electrical resistance, such as contacts that are used in low energy, high performance electrical contact/connector applications including leads for transistor packages, leads for hybrid circuit packages, printed wiring board termination contacts, pins and sockets, and the like. Special problems arise when providing low force contacts or electronics connectors that have critical tolerances and must be of especially high reliability and consistency, especially consistency of contact resistance. This invention relates to these types of high technology contacts or connectors.

Prior improvements were made in these type of contacts by adding a layer of highly conductive yet corrosion resistant noble metal, usually a precious metal such as gold, plated over the copper substrate; however, this approach does not provide the ideal solution because high rates of corrosion and contact resistance deterioration are still exhibited when the contacts are subjected to severe environments. In such environments, there is a migration between the base metal and the noble or precious metal at the pore sites of the noble metal, characterized by a degradation mechanism that involves migration of the base metal corrosion products onto and across the noble metal surface. This migration and corrosion problem is reduced somewhat by providing a particularly thick gold layer, which is unsatisfactory for many applications because this approach significantly increases the cost of these electrical contacts.

Efforts to avoid the use of substantial quantities of gold have included over-plating the base metal with an electroless nickel deposit that is of a density and thickness adequate to significantly reduce corrosion of the base metal by providing a thick and dense intermediate electroless nickel layer. Unfortunately, the typical thick and dense electroless nickel layer is of relatively low conductivity when compared with metals such as copper and gold, thereby impairing the overall electrical contact resistance properties of the connector or contact. Additionally, many electroless nickel deposits themselves tend to oxidize, thereby further deteriorating the electrical contact resistance properties of the overall contact material.

Previous attempts to improve on the approach of overlaying a copper base with an electroless nickel deposit or other interior layer included plating a layer of noble or precious metal such as gold over these internal layers. This represented an effort to reduce the oxide buildup associated with the internal layer while enhancing conductivity. This approach has not been particularly successful except in those instances where the internal or electroless nickel layer is relatively thick in order to substantially reduce migration and where the gold layer is also relatively thick in order to lower the contact resistance to levels that are acceptable according to industry standards. This approach brings with it the disadvantage of being expensive due to the amount of gold needed and of experiencing bonding problems to the extent that there tends to be some separation between the layers of these electrical contacts, especially when they are subjected to deforming or bending forces.

The present invention advances the electrical contacts art by providing an electroless nickel barrier layer between the conductive substrate layer, usually copper, and the noble or precious metal layer, usually gold, which electroless nickel barrier layer assists in providing electrical contacts or conductors that exhibit superior contact resistance properties and exceptional resistance to corrosion over extended periods of time while simultaneously minimizing the quantity of noble or precious metal needed as the overlayer deposit. By the present invention, there is provided an electroless nickel barrier layer deposit that exhibits exceptional ability to diminish the tendency of metals, particularly copper, to migrate thereacross, this barrier layer being an electrical contact material that exhibits desirable electrical properties and which retains those properties under severe exposure conditions. The electrical contact material according to this invention also exhibits excellent bondability both initially and after storage and use for extended time periods.

It is accordingly a general object of the present invention to provide improved electrical contact materials.

Another object of the present invention is an improved multi-deposit electrical contact material that adheres to industrial contact resistance standards for precious metal contacts.

Another object of this invention is to provide an improved electrical contact material having a contact resistance of a magnitude generally on the order of 5 milliohms, which contact resistance is maintained for substantial periods of time under severe exposure conditions.

Another object of the present invention is to provide an improved multi-component deposit that exhibits excellent electrical conductivity which remains relatively constant over extended time periods, even under severe exposure conditions.

Another object of the present invention is to provide an improved electrical contact product that possesses excellent bondability and electrical properties which are retained for extended time periods.

Another object of this invention is to provide an electrical contact material that exhibits and retains excellent bondability to conductors by procedures such as diode bonding and ultrasonic bonding.

Another object of the present invention is to provide an improved bath system or composite bath for providing multiple, serial baths for preparing improved electrical contact materials.

These and other objects of the present invention will be apparent from the following detailed description thereof, taken in conjunction with the accompanying drawings, wherein:

FIG. 1 plots contact resistance data prior to environmental exposure testing of gold flashed coupons prepared in accordance with Example I;

FIG. 2 plots contact resistance data of the coupons of FIG. 1 after environmental exposure testing for 48 hours;

FIG. 3 plots contact resistance data of the coupons of FIG. 1 after environmental exposure testing for 114 hours;

FIG. 4 plots contact resistance data of the coupons of FIG. 1 after environmental exposure testing for 154 hours;

FIG. 5 plots contact resistance data of the coupons of FIG. 1 after environmental exposure testing for 250 hours;

FIG. 6 plots contact resistance data of the coupons of FIG. 1 after environmental exposure testing for 364 hours;

FIG. 7 plots a summary of contact resistance data from FIGS. 1 through 6 as a function of the environmental exposure times;

FIGS. 8, 9 and 10 plot contact resistance data for coupons not having a gold flash;

FIG. 11 plots contact resistance data prior to environmental exposure testing of gold flashed coupons prepared in accordance with Example II;

FIG. 12 plots contact resistance data of coupons of FIG. 11 after environmental exposure.

FIG. 13 is a perspective illustration of the composite system according to this invention;

FIG. 14 is a section through an embodiment of the electrical contact material according to this invention; and FIG. 15 is a section through another embodiment of the electrical contact material.

Figure 1:
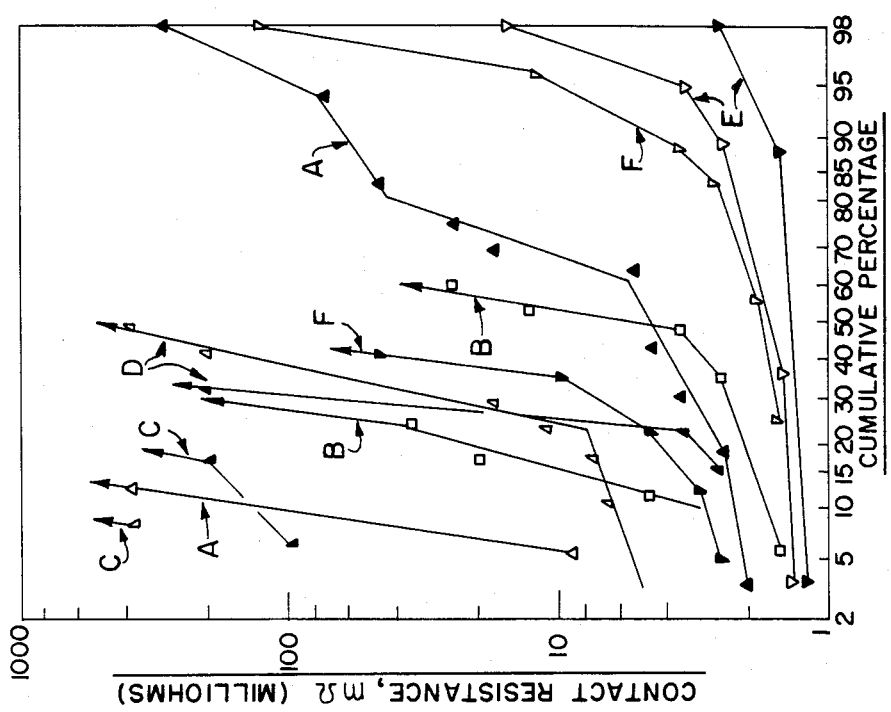
Figure 2:
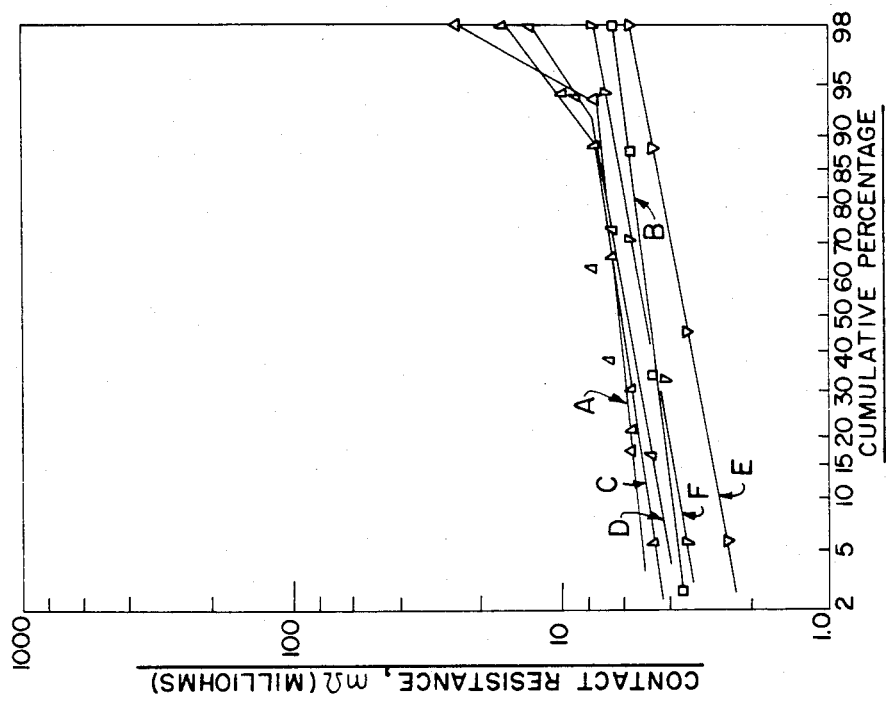
Figure 4:
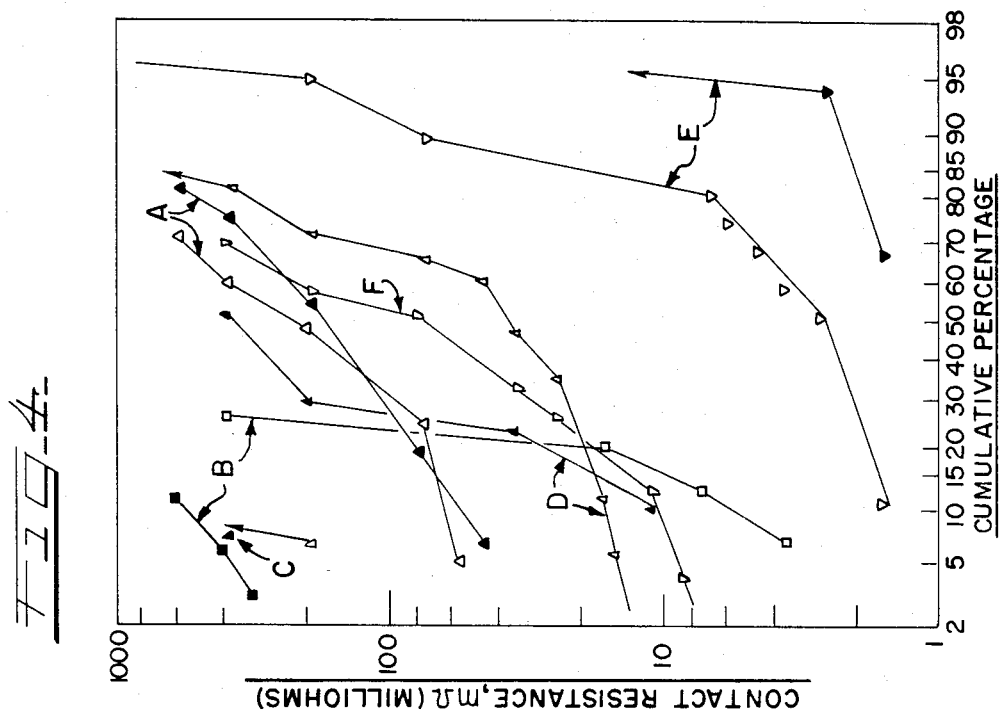
Figure 3:
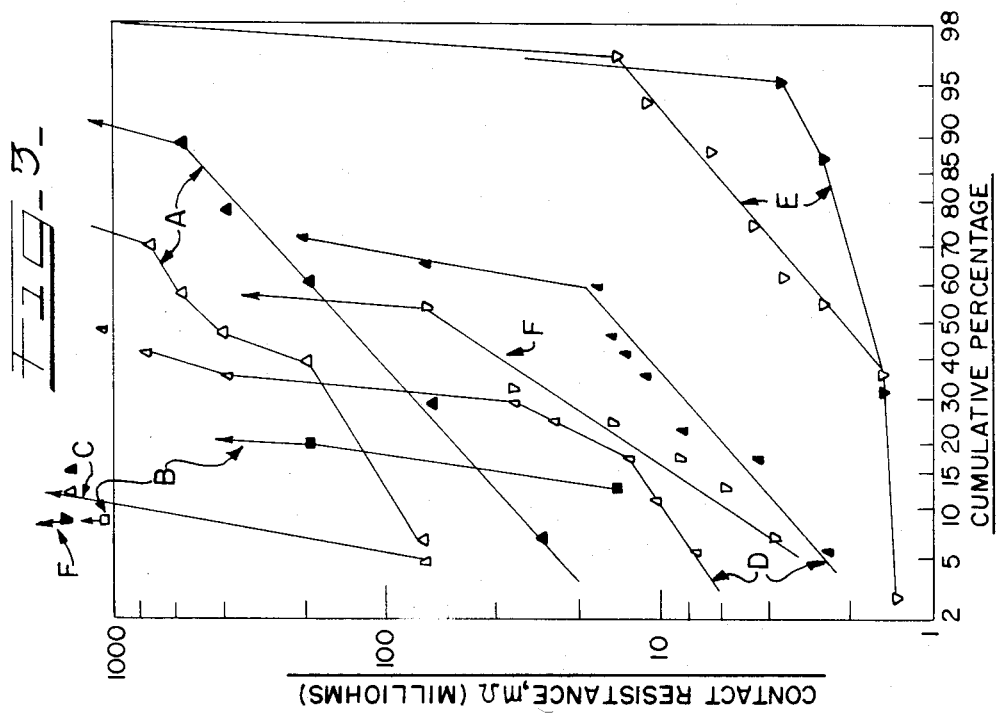

In accordance with the present invention, electrical contact materials are provided which include a conductive basis metal substrate material, an electroless nickel deposit barrier layer, and an exceptionally thin noble metal or precious metal deposit thereover. The electroless nickel barrier layer is deposited from an electroless bath that forms a nickel-boron or nickel-phosphorus deposit of a particular type that is exceptionally homogeneous and that cooperates with the substrate layer or a deposit thereover, the electroless nickel barrier layer further cooperating with the noble metal or precious metal overdeposit to provide an electrical contact material that meets industry contact resistance standards and substantially retains those standards under severe exposure conditions.

The class of nickel-boron electroless baths includes boron deposition enhancers, together with a borane reducing agent and a source of nickel, while other typical electroless nickel bath ingredients may be included, such as complexing agents, stabilizers, buffers, and the like. The class of nickel-phosphorus electroless baths includes an unsaturated carboxylic acid tensile stress reduction agent, together with a reducing agent and a phosphorus source and other electroless nickel bath ingredients. The electroless nickel-boron and nickel-phosphorus baths and deposits according to this invention are the subject of copending U.S patent applications Ser. No. 286,971, filed July 27, 1981, and Ser. No. 295,523, filed Aug. 24, 1981, the subject matter of which is incorporated by reference hereinto.

Nickel-boron electroless baths of this invention include a boron deposition enhancer such as zirconyl ions, vanadyl ions, or combinations thereof. It is believed that the boron deposition enhancers impart added stability to the borane reducing agent in the bath while also enhancing its boron depositing capabilities at moderate pH values. Zirconyl ion boron deposition enhancers can be added to the bath by any compound that will liberate zirconyl ions ($ZrO^{++}$), such as zirconyl chloride octahydrate ($ZrOCl_2.8H_2O$). Vanadyl ion ($VO^{++}$) boron deposition enhancers can be provided by compounds such as vanadyl sulfate or vanadium oxysulfate ($VOSO_4.2H_2O$) or other vanadyl salts, as well as by vanadates such as sodium metavanadate ($NaVO_3.4H_2O$), which vanadates oxidize organic compounds within the bath and in turn themselves undergo reduction to provide vanadyl ions within the bath.

Boron deposition enhancers are included within the baths for laying down the electroless nickel-boron barrier layer at a concentration having a lower limit of that at which the particular enhancer increases the boron deposit percentage and an upper limit guided by economic and bath solubility considerations. A typical concentration of the boron deposition enhancer within the bath is at least about 0.0005 mol per liter, preferably at least about 0.0007 mol per liter, and most preferably at least about 0.001 mol per liter. Usually, there is no need to include these boron deposition enhancers at bath concentrations in excess of 0.5 mol per liter, preferably not greater than 0.1 mol per liter.

Borane reducing agents utilized in these nickel-boron depositing baths include any bath-soluble borane source such as the amine boranes, lower alkyl substituted amine boranes, ammine boranes, and nitrogen-inclusive heterocyclic boranes including pyridine borane and morpholine borane. Such compounds are typically characterized by their inclusion of a $BH_3$ group. Generally, the alkyl amine boranes are preferred, especially dimethylamine borane. Reducing agent concentrations within these baths are those that are sufficient to effect adequate reduction and are also cost-efficient for reducing the nickel cations within the bath. Typical minimum concentrations are at least about 0.001 mol per liter of bath, more usually at least about 0.005 mol per liter, while as much as 1 mol per liter could be included, and usually no more than about 0.1 mol per liter need be included to accomplish typically desired results.

Sources of nickel for these nickel-boron baths are typical bath soluble nickel salts such as the sulfates, chlorides, sulfamates, or other anions compatible with electroless nickel systems. Concentrations utilized are those that are typical for electroless nickel plating baths, on the order of between about 0.001 mol per liter of bath and about 0.5 mol per liter.

Almost any type of complexing agent can be selected for inclusion within the nickel-boron baths, depending upon considerations such as availability, economics, and properties desired for the particular bath in addition to that of forming the advantageous multi-layered combination of this invention. Complexing agents are, generally speaking, bath soluble carboxylic acids and bath soluble derivatives thereof, including hydroxy-substituted carboxylic acids, amino-substituted carboxylic acids, and bath soluble derivatives thereof including anhydrides, salts or esters that are bath soluble. Other complexing agents include ester complexes of polyhydric compounds formed by reacting an oxyacid with a polyhydric acid or alcohol such as those described in Mallory U.S. Pat. No. 4,019,910. Further complexing agents include pyrophosphoric acid and its derivatives as well as organophosphoric complexing agents including phosphonates.

Specific hydroxy substituted carboxylic acid complexing agents of this type include citric acid, glycolic acid, lactic acid and malic acid, while exemplary amino-substituted carboxylic acid complexing agents include β-alanine, aminoacetic acid, aminodiacetic acid, and the amino acids such as α-alanine, aspartic acid, glutamic acid, glycine, lucine, serrine, triosine, and valine. Complexing agents falling within the category of ester complexes of oxyacids and polyhydric acids or alcohols include ester complexes prepared by reacting an oxyacid with a carboxylic acid or alcohol compound which contains at least two hydroxy groups and from about 4 to about 15 carbon atoms per molecule. Typical suitable polyhydric compounds include carboxylic acids such as tartaric acid, gluconic acid or glucoheptonic acid, and alcohols such as mannitol, 2,3-butanediol and 1,2,3-propanetriol. The oxyacids used in forming the ester are generally inorganic acids such as boric, tungstic, molybdic or chormic acids. Usually, such ester complexes are in the form of a polyester that is an ester compound formed by reacting two or more moles of the oxyacid with one mole of the polyhydric compound. Phosphonate complexing agents suitable for incorporation into the nickel-boron bath include aminotri(methylenephosphonic acid) and salts thereof such as a solution of the pentasodium salt of amino(methylenephosphonate), 1-hydroxyethylidene-1,1-diphosphonic acid and salts thereof such as the trisodium salt of 1-hydroxyethylidene-1,1-diphosphonic acid, ethylenediamine tetra(methylphosphonic acid) and salts thereof, and 1,6-diaminohexane tetra(methylphosphonic acid) and the alkaline metal and ammonium salts thereof.

Complexing agent bath concentrations will, of course, be somewhat dependent upon whatever particular complexing agent or agents are included within the bath. Generally speaking, complexing agents within the bath are at a concentration of at least about 0.0005 mol per liter and can be as high as bath solubility limits and economic considerations dictate, usually no higher than about 1.5 mol per liter. A typical range is between about 0.005 and about 1 mol per liter of bath, preferably between about 0.1 and 0.7 mol per liter, especially when the complexing agent is a carboxylic acid.

These nickel-boron baths may optionally include stabilizers such as those of the carboxylic acid type, sources of antimony or of lead for controlling the sulfide ion content, or a sulfur containing compound such as thiourea or a combination thereof such as thiodiglycolic acid. Whenever a sulfur-containing compound is added, the sulfur content must be carefully controlled, since excessive sulfur will reduce the boron content of the deposit. Any such sulfur addition should be monitored so that the maximum sulfur concentration is about 20 ppm as divalent sulfur. Otherwise, when stabilizers are added to the bath, they are at a concentration typical for the particular compounds.

The electroless nickel-phosphorus baths included in the present invention have a tensile stress reduction agent that is an unsaturated carboxylic acid of the formula: $R(COOH)_n$ and bath soluble derivatives thereof, wherein R is an unsaturated alkyl chain having at least two carbon atoms and whererin n is at least one. Further included within the bath is a source of nickel and a reducing agent which may also be the phosphorus source. Typically, the nickel-phosphorus bath will be free of sulfur except for sulfur in its highest oxidation state, for example sulfur added as nickel sulfate to supply the nickel to be plated by the bath. Other typical electroless nickel bath additives may also be included, provided they do not otherwise adversely affect the advantageous properties of the bath.

With more particular reference to the tensile stress reduction agent of the nickel-phosphorus baths, R represents an unsaturated alkyl group having a carbon chain length short enough to obtain bath solubility when the tensile stress reduction agent is either in its acid form or in the form of a bath soluble derivative thereof, the carbon chain length typically being no greater than 20, preferably no greater than 10, and most preferably no greater than 6, and n is preferably 2 or more, most preferably 2. Exemplary unsaturated acid tensile stress reduction agents include aconitic acid, citraconic acid, fumaric acid, itaconic acid, maleic acid, and their bath soluble derivatives, which will preferably be present within the electroless nickel bath at a concentration of at least about 1 gm/l (about 0.005 mol per liter), with the upper limit being a matter of economics and bath solubility. There reaches a point, typically at no more than approximately 10 gm/l (about 0.1 mol per liter), based on the total bath, at which added stabilizer no longer increases the advantageous properties of this invention.

Referring more particularly to the preferred sulfur-free characteristic or condition of these baths, the inclusion of any sulfur should be at an oxidation state of sulfur that is not lower than its highest oxidation state, such as that of the sulfate group. Many electroless nickel baths often include sulfur-containing compounds, either as bath impurities or as an added constituent for bath stabilization or some other function. The sulfur-free baths of this invention do not include divalent sulfur containing compounds such as the organic sulfur-containing compounds, the organic and inorganic thiocompounds, and the inorganic sulfides. Representative organic sulfur-containing compounds are thiourea and its derivatives, dithioglycol, thioglycolic acid, 2,2-thiodiethanol, 1,2-ethanedithiol, 2-mercaptobenzothiazole, 1,2-benziosothioazine, methionine, and the like. Thiocompounds include the thiocyanate salts and the thiosulfate salts such as sodium thiocyanate, potassium thiocyanate, potassium dithionate, sodium thiosulfate, potassium thiosulfate, and the like. Typical inorganic sulfides are sodium sulfide, potassium sulfide, sodium polysulfide, potassium polysulfide, and the like.

A buffer is typically included within the baths making the deposits according to this invention, especially the nickel-phosphorus deposits. While traditional monocarboxylic acid derived buffering systems may be incorporated in baths according to this invention, such as acetic acid-sodium acetate systems, boric acid-borate systems, and propionic acid-propionate systems, maximum efficiency of these baths, especially in connection with the enhancement of phosphorus deposition percentages without adversely affecting the plating rate, is attained when the buffer is a saturated alkyl or aromatic polycarboxylic acid and/or bath soluble derivative thereof, which may be exemplified by the formula: $R'(COOH)_p$, wherein R' is a saturated carbon chain of up to 20 carbon atoms or an aromatic ring containing a chain of not more than 20 carbon atoms, and p is at least 2, preferably 2. Preferably R' is a carbon chain of not more than 10 carbon atoms, more preferably of not more than 6 carbon atoms. Especially preferred buffers are those defined when R' is betwewen 2 and 4 and when p is 2, and combinations of such buffers.

As is typically the case for buffering systems, these buffers may be provided as acids in combination with salts or esters thereof. Exemplary buffers in accordance with this invention include the acid and salt or ester forms of adipic acid, glutaric acid, isophthalic acid, malonic acid, oxalic acid, and succinic acid. These buffers are included within the electroless nickel baths at a total concentration of at least about 1 gm/l (approximately 0.005 mol per liter), the concentration being varied according to needs for maintaining pH control, which concentration will usually be no more than about 40 gm/l (approximately 0.4 mol per liter) and often not more than about 20 gm/l (approximately 0.2 mol per liter).

It is also preferred within the nickel-phosphorus baths to include, in combination with the unsaturated carboxylic acid tensile stress reduction agent, and preferably in further combination with the saturated alkyl or aromatic carboxylic buffer systems, a complexing agent of the type that is a hydroxy and/or amino substituted carboxylic acid having the general formula $XR''(COOH)_s$, wherein X is either or both a hydroxy group or an amino group, including OH, NH, $NH_2$, $+NH$, $+NH_2$, $+NH_3$, it being especially preferred that the X group is in the alpha position relative to at least one of the carboxylic groups; R" is saturated alkyl, heterocyclic, or alkylaryl, and may be substituted or unsubstituted, the carbon chain length being between 1 and about 14, and preferably not greater than about 6, especially preferred compounds having an R" chain length of not more than 4; and s may be between 1 and 4. The carboxylic acid group may be in the acid, anhydride, salt or ester form, provided it is bath soluble. Such complexing agents include the amino acids such as α-alanine, aspartic acid, glutamic acid, glycine, and the like, as well as citric acid, glycolic acid (hydroxyacetic acid), iminoacetic acid, iminodiacetic acid, lactic acid and malic acid. These complexing agents are included within the baths at a concentration of at least about 1 gm/l (approximately 0.0005 mol per liter), with the upper limit being dictated by economic considerations and bath solubility limitations, with a typical upper limit being no more than about 100 gm/l (approximately 1.5 mol per liter). A typical range is between about 0.005 and about 1 mol per liter of bath, preferably between about 0.1 mol per liter and about 0.7 mol per liter (approximately 50 gm/l).

The nickel-phosphorus baths must also contain a reducing agent and a source of phosphorus, and the well-established manner of accomplishing same is to utilize a reducing agent that is also a source of phosphorus ions, such as the widely used reducing agent sodium hypophosphite. The bath also, of course, includes a source of nickel, which may be added as a bath-soluble salt, such as the sulfates, chlorides, sulfamates, and other anions compatible with these electroless systems. Typically the baths will be operated at a temperature of between about 160° and 212° F. (about 71° to 100° C.).

These nickel-boron or nickel phosphorus deposition baths may, if desired, also contain conventional bath additives that are commonly employed in electroless nickel deposition baths. Included are traditional buffers and buffering systems, such as acetic acid/sodium acetate, complexing agents and stabilizers, codeposition enhancers, pH adjusting agents and the like, except that care must be taken with respect to incorporating sulfur into the bath. Polyalloy deposition may be accomplished by including bath-soluble compounds such as a polyhydric acid or alcohol with an oxyacid of the metal to be deposited as part of the polyalloy with nickel and boron or other metal.

The basis metal upon which the electroless nickel barrier layer is deposited is typically a non-noble electrical conductor, which basis metal may be a metal substrate or a plating deposit of the basis metal onto another substrate suitable for the particular end use application. Typical basis metals include copper, oxygen-free high conductivity copper, phosphor-bronze or copper tin alloys, beryllium-copper alloys and nickel-chrome alloys. Such basis metals often are deposited onto shaped substrates including transistor and printed wiring board components such as leads for transistor packages, leads for hybrid circuit packages, printed wiring board termination contacts, pins and sockets, pads and header pins, and the like. Basis metal deposits are typically between about 100 and 800 microinches (0.0001 to 0.0008 inch, or about 2.5 to 20 microns). Most such basis metal structures and/or deposits are provided in accordance with known principles and practices associated with each particular basis metal.

The noble or precious metal overlayer that is laid down after the electroless nickel barrier layer of the deposit according to this invention is a very thin coating or a deposit in the nature of a "flash" of the noble or precious metal, usually gold, onto or over the electroless nickel deposit or barrier layer. The amount of this "flash" deposit is considerably less than that of a typical gold deposit overlayer, which is usually on the order of no less than 50 microinches (0.00005 inch, or about 1.3 micron), the flash gold deposit according to this invention being more on the order of a maximum of about 10 microinches (0.00001 inch, or about 0.25 micron) or slightly greater values, with a preferred flash deposit being on the order of no greater than 5 microinches (0.000005 inch or about 0.13 micron). The amount of the flash deposit is primarily a matter of economics, the thinner the deposit, the less the quantity of precious metal needed to prepare the product until the deposit is so thin that there is no longer an effective amount of precious metal overlayer. Because of the small quantities involved, exact measurements of the effective amount are extremely difficult; it is estimated that such an effective amount is no less than approximately 1 microinch (0.000001 inch or about 0.025 micron).

Such noble or precious metal overlayer may be laid down in any manner, whether by an electrolytic or an electroless bath, provided such bath does not detrimentally affect the underlayers of the product being produced. Typical exemplary electrolytic baths will lay down a 23 karat gold deposit having a trace of cobalt and of indium, which deposits can be accurately measured and produced by known coulomb meter techniques.

In proceeding with the preparation of electrical contact materials according to this invention, a multiple-bath system or composite system is provided as illustrated in FIG. 13. The upstream component 21 of the composite bath is an electrolessly or electrolytically depositing system for laying down or other means for providing, a non-noble metal that is a very good electrical conductor, typically a metal that has a high copper content. The shaped substrate 22 is immersed within the upstream component until the desired deposit thickness is attained.

Next, the basis metal-deposited shaped substrate 23 is conveyed to an intermediate component 24 of the composite bath system, which intermediate component has a nickel-boron bath or a nickel-phosphorus bath. The nickel-boron bath is a borane-reduced electroless nickel bath having a moderate pH and a moderate temperature, which bath includes a source of zirconyl and/or vanadyl ions. The operational pH is less than 13, typically between 4 and 10, and preferably the bath pH is maintained between about 5 and 7 while the temperature is maintained below 90° C., typically between about 60° and about 70° C. By such procedure, nickel from the nickel source in the bath deposits with boron from the reducing agent, this deposit including in excess of 2 weight percent boron, typically in excess of 2.2 weight percent boron, based on the total weight of the deposit. This aspect of this invention includes preparing an electroless deposition bath including a bath-soluble source of nickel, a bath-soluble borane reducing agent, a boron deposition enhancer that liberates vanadyl ions and/or zirconyl ions when added to the bath, preferably in combination with an electroless bath complexing agent. Preparing the bath may optionally include adding one or more stabilizers, sulfide-content controllers, buffers, buffering systems, polyalloy deposition sources, codeposition enhancers, and the like. Typically, it will be necessary to adjust the pH of the bath to within the desired moderate pH range, which is usually a strong base such as hydroxide to the bath, or when the pH becomes too high by adding a strong acid, such as sulfuric acid or other mineral acids.

When the nickel-phosphorus deposit is to be laid onto the basis metal during the method according to this invention, an electroless deposition bath is prepared to include an unsaturated carboxylic acid compound $R(COOH)_n$ as previously defined herein, a source of nickel, a reducing agent and a source of phosphorus, said bath being a sulfur-free bath as defined herein. Also typically included is the buffer compound $R'(COOH)_p$, usually in combination with the hydroxy and/or amino substituted carboxylic acid complexing agent of the formula $XR''(COOH)_s$. The bath lays down a deposit that is low in tensile stress and that has a high phosphorus content while avoiding a substantial slowing of the deposition rate by maintaining the pH at as high a value as can be attained by the combination of bath ingredients. More particularly, the bath prepared according to this invention has a pH above 4.0, typically at least about 4.5, usually on the order of 5.0, including a pH of 5.0±0.5, preferably a pH of 5.0±0.3, and most preferably a pH of 5.0±0.2

Substrates 23 from the upstream component 21 of the composite bath and having the basis metal surface are immersed in the nickel-boron or nickel-phosphorus intermediate bath component thus prepared. The weight or thickness of the deposit laid down by the bath will vary, of course, with the plating rate and the length of time that the substrate 23 is immersed within the bath 24. Plating rates according to this method are between about 0.2 and up to about 0.8 mil per hour, and typical tank loadings are between about 0.25 and 1.0 square foot per gallon of bath. Especially when the nickel-phosphorus bath is utilized, the intermediate bath's barrier layer deposit has an especially low tensile stress condition for a deposit from a bath at a relatively high pH and that exhibits a rate of deposition that is rapid for a bath that lays down a deposit having a high phosphorus content. This aspect of the method according to this invention results in a barrier layer deposit having a low internal tensile stress, which includes substantially zero internal stress as well as an internal stress in the compressive or negative range.

The composite bath according to the invention may include an underlayer component 25, which may have catalyzing or nucleating properties between the upstream component 21 and the intermediate component 24, if desired, in order to enhance the bonding of the barrier or intermediate layer to the basis layer. Further included is a downstream component 26 that is located after the intermediate component 24, such downstream component 26 being an electrolytic or an electroless bath that is especially suitable for depositing a noble metal or precious metal such as gold at levels that are characteristically of a "flash" thickness in order to prepare content products 27 according to this invention.

The electrical contact materials prepared according to this invention with multiple-layer deposits are illustrated in FIGS. 14 and 15. FIG. 14 shows a contact product 27a without an underlayer, the product 27a including the conductive substrate material 31, followed by the electroless nickel barrier layer 32 and then by the flash of noble or precious metal 33, and FIG. 15 illustrates the contact product 27 having an underlayer 34. The contact materials of these products have a contact resistance that meets industry standards in this regard, generally on the order of 10 milliohms determined by ASTM test procedure B-667-80. Heretofore, meeting these industry standards required a hard gold deposit of on the order of 100 microinches (0.0001 inch or about 2.5 microns). With more particular reference to ASTM B-667-80, this test directly measures surface effect changes in contact resistance, including those due to corrosion reactions that lead to surface film formation, the test itself including measuring the resistance by probing the surface of the contact material with a ⅛ inch diameter, hemispherically-ended gold rod gently lowered onto the surface at a force of 100 grams normal to the surface. This test can be varied by changing the force applied by the rod, typically to 25 or 200 grams. Multiple data points are obtained on each sample at random locations over the surface. Electrical conditions are at dry circuit levels of 50 millivolts open circuit voltage and 10 milliamperes of current.

Electroless nickel-boron barrier layers 32 of these electrical contact materials have a boron content of at least about 2 weight percent, and the boron contents can be as high as or in excess of about 5 weight percent, based on the weight of the intermediate deposit. Typically, they will exhibit enhanced hardness, on the order of from 800 to 1000 $VHN_{50}$. Electroless nickel-phosphorus barrier layers 32 of these electrical contact materials preferably have a phosphorus content of at least 10 percent, with the maximum phosphorus content being limited only by the maximum phosphorus deposition capabilities of the total intermediate bath, such maximum amount typically approaching not more than about 15 percent phosphorus. The thickness or the quantity of the nickel phosphorus deposit varies, of course, with the plating rate and the length of time that the metal substrate is immersed within the bath. Typical hardness values for the deposits are between 500 and 600 $VHN_{100}$ and between 800 and 950 $VHN_{100}$ after heat treatment at 400° C. for one hour. Typically, the intermediate nickel-boron or nickel-phosphorus barrier layer 32 will have a deposit thickness of between about 25 and 1000 microinches, typically between about 50 and 800 microinches, and preferably between about 100 and 700 microinches, while the underlayer 34, when included, has a deposit thickness of between about 150 and 600 microinches. Usually, the total thickness of the intermediate layer plus any underlayer is between about 175 and about 1000 microinches, typically about 700 microinches, of deposit between the basis metal and the flash precious metal overdeposit.

The following examples are offered to illustrate the present invention.

EXAMPLE I

Evaluation of the contact resistance properties of multi-layered contact materials of this invention was carried out on flat 1 by 3 inch coupons in which the basis or substrate material was half hard copper, a well-known type of substantially pure copper. The basis metal of the coupons was overdeposited with 250 microinches of an electroless nickel underlayer layer for catalyzing or nucleating the copper surface, this catalyzer layer being a nickel-phosphorus alloy laid down from a hypophosphite-reduced bath having nickel sulfate as the nickel source and a thiourea additive, the bath having none of the unsaturated carboxylic acid tensile stress reduction agents defined herein. The thus nucleated copper was overdeposited with 125 microinches of an electroless nickel-boron barrier layer having a boron content of 2.7 percent, such nickel-boron barrier layer having been laid down by an electroless bath including 0.1 mol per liter of nickel, 0.3 mol per liter of lactic acid, 0.08 mol per liter of citric acid, 0.04 mol per liter of dimethylamine borane, and 0.001 mol per liter of vanadyl sulfate. Next, a thin 23-karat gold film was electrolytically deposited over the nickel-boron barrier layer, the coulomb meter adjustment being such as to lay down a deposit of 3 to 5 microinches (0.000003–0.000005 inch) of gold. This contact material is identified as the Coupon A material.

Numerous sets of other coupons were prepared that were not in accordance with this invention, these other sets being characterized by the following coupon material designations.

Coupon B was substantially identical to Coupon A, except the barrier layer was 125 microinches of an electroless nickel-boron deposit having a boron content of 0.1 percent that was laid down by a dimethylamine borane reduced bath including thiodiclycolic acid as a stabilizing agent, which bath did not include a boron deposition enhancer as defined herein.

Coupon C was substantially identical to Coupon A, except the barrier layer was 125 microinches of an electroless polyalloy of nickel, boron and tungsten that was laid down by a sodium glucoheptonate reduced bath that did not include a boron deposition enhancer as defined herein. The polyalloy had a boron content of 1.5 percent.

Coupon D had the basis material and thin gold overlayer of Coupon A. The underlayer and the barrier layer were replaced with a 125 microinch deposit of the underlayer electroless nickel-phosphorus alloy of Coupon A.

Coupon E was the control in which the copper basis material was electrolytically overplated with 100 microinches (0.0001 inch) of the gold deposit, (a "thick gold" deposit), these coupons having no electroless nickel layer.

Coupon F was substantially identical to Coupon A, except the barrier layer was 125 microinches of an electroless nickel-boron deposit having a boron content of 0.3 percent that was laid down by a bath which did not include a boron deposition enhancer as defined herein.

Coupon A*, Coupon B*, Coupon C*, Coupon D* and Coupon F* were substantially identical to Coupon A, Coupon B, Coupon C, Coupon D and Coupon F, respectively, except the thin gold film overlayer was omitted.

FIGS. 1 through 7 plot the content resistance distributions of Coupons A, B, C, D, E and F, whereby the contact resistance values determined by ASTM test B-667-80 are plotted as a cumulative percentage. Unless otherwise specified, the testing was under 100 gram force. Because the coupons had been treated with a mineral oil lubricant, data were gathered both for coupons in their "as received" or lubricated condition and for coupons that had been cleaned by a solvent degreasing procedure during which the coupons were immersed in boiling acetone for one minute and stored in clean, individual glass bottles. In FIGS. 1 through 7, the data points designated by solid symbols are those of the "as received" coupons while the open symbols designate the degreased coupons.

The FIG. 1 data were obtained at a low force of 25 grams initially after the coupons were degreased. At this force, resistance tails were found on the distributions for Coupons A, C and D, although the tails were not apparent under the standard force of 100 grams (data not shown).

FIGS. 2 through 6 report contact resistance distribution data after various environmental exposure times. The environmental exposure was to a flowing mixed-gas environment containing low levels of hydrogen sulfide, sulfur dioxide, nitrous oxide and chloride gas in air at 30° C. and 75 percent relative humidity, a 20-day exposure period to this environment simulating the equivalent of approximately 10 years of exposure in a relatively severe, indoor, industrial equipment environment. The FIG. 2 data were after a 2-day (48 hours) exposure, the FIG. 3 data being after 114 hours, the FIG. 4 data being after 154 hours, the FIG. 5 data being after 250 hours, and the FIG. 6 data being after 364 hours.

While these types of coupon studies are very useful for judging the relative performance of different contact materials, coupon testing conditions are actually much more harsh than conditions that are encountered by actual electrical contacts which are shaped to provide contact interfaces that are relatively well shielded from the environment by such structures as connector housings. This means that the in-use corrosion rate at a shaped connector interface will be considerably lower than the corrosion rate determined by coupon studies. Nevertheless, it is accepted that a medium level of resistance of 10 ohms at 200 grams for coupons is a very high and unacceptable resistance if that deposit were to be used for a shaped contact, with a coupon resistance of greater than 1000 milliohms at 100 grams typically still being unacceptable for most shaped contacts made of that coupon contact material.

Contact resistance measurements shortly after degreasing (FIG. 1) indicate potential acceptability for all of the coupons. The contact resistance rises for each of the coupons when subjected to the environmental test conditions over time, with the control Coupons E (extremely thick gold) showing the least change. By 364 hours of exposure (FIG. 6), only the control and the Coupon A set remain within the 1000 milliohm range at 100 g.

Another indication of the advantageous properties of the Coupon A set is shown by the FIG. 7 plot, which presents a summary of the contact resistance data as a function of the various environmental exposure times for the four best coupon sets and for a conventionally prepared coupon that typically meets industry standards, the conventional material being a copper based coupon having a sulfamate nickel electroless intermediate layer under a layer of 50 microinches of gold. The conventional coupon data are shown by the dotted line plot. The superiority of the Coupon A data over the conventional data is clearly indicated when it is noted that the contact resistance rises to 360 milliohms after only about 200 hours for the conventional contact material, while that resistance level is not reached by Coupon A until after about 500 hours.

While the data in FIG. 7 show, as expected, that the control Coupon E having the very expensive, thick gold contact surface has the best overall performance, FIG. 6 presents a more complete picture of the relative performance of the Coupon A and E materials, where it is found that a sharp resistance tail begins to develop even on the Coupon E set after prolonged environmental exposure. In fact, at this point, the Coupon E high resistance tail actually crosses that of the Coupon A set, meaning that the probability of high resistance events is considerably lowered by the use of the Coupon A contact material.

Visual observation of these coupons for signs of corrosion indicated relatively little corrosion for the Coupon A set after 100-150 hours when compared to the other contact materials, further indicating that the Coupon A material can significantly delay the onset of corrosion reactions, which is in sharp contrast, for example, to the Coupon C set which showed very unusual and extremely severe corrosion even at as short an exposure time of 114 hours.

FIGS. 8, 9 and 10 plot contact resistance data for the Coupon A*, B*, C*, D* and F* sets. With reference to FIG. 8, which relates to the coupons "as received", the open symbols indicate the tests were run under a 100-gram force and the solid symbols under a 200-gram force. Data from the Coupon A* and D* sets were above the 10 ohm (10,000 milliohm) level and were not plotted because this level of contact resistance during a coupon test is very high and clearly unacceptable. In fact, all of the data of FIG. 8 indicate that the Coupon A*, B*, C*, D* and F* sets are unacceptable by present standards of contact resistance. This conclusion is supported by examination of both the median level of contact resistance and, more importantly, by the portion of the distribution towards the right-hand side of the graph, i.e., the percentage of very high resistance events. At the 100-gram level, only Coupon C* showed resistance characteristics which even approached acceptable levels. At the 200-gram level, Coupons B*, C* and F* remained within the range where data could be plotted. Coupons A* and D* gave extremely high contact resistance.

FIG. 9 reports data for coupons after chemical cleaning by first degreasing them and then immersing them for 30 seconds in a 50 percent hydrochloric acid solution at room temperature, followed by rinsing in three separate portions of distilled water, immersion for 15 seconds in 50° C. isopropyl alcohol and air drying for 2 minutes. The contact resistance tests were conducted within 30 minutes of such chemical cleaning. Included in FIG. 9 is a plot of an "as received" Coupon C that was tested at 100 grams (the open circle data) and a plot of an "as received" Coupon C that was tested at 200 grams (the closed circle data). All materials fell below a 1 ohm criterion at median levels, and all are unacceptable by contact resistance standards. Coupons B* and F* gave initial contact resistance which actually approached that of conventional contact materials. The data are not fully shown since they were mostly off the bottom of the scale. Coupons A* and C* gave intermediate and somewhat marginal performance, while Coupon D* clearly gave the highest contact resistance.

FIG. 10 gives data for the cleaned coupons after laboratory storage under clean conditions, the open symbols indicating one week of storage and the solid symbols indicating four weeks of storage. Even this clean storage resulted in significant degradation due to the formation of very thin surface films, and all coupons were unsatisfactory according to contact resistance standards. The data should not necessarily be regarded as a measure of the chemical reactivity of the material; instead, they are largely reflections of the film thickness and/or mechanical properties of the surface films which form. Of these materials, only Coupons B* and F* give contact resistance approaching acceptable levels. Coupon C* is marginal, and Coupons A* and D* are unacceptable due to the high resistance tails on the distribution.

EXAMPLE II

Additional coupons were prepared with a base material that was half hard copper (CDA-110) which was chemically polished, the edges thereof having been mechanically polished prior to plating. Different types of electrical contact materials were plated over the polished copper surfaces of the sets of coupons, characterized as follows.

Coupons AJ had an electroless underlayer of 225 microinches of an electroless nickel-phosphorus deposit plated from a sodium hypophosphite reduced bath including lactic acid and lead nitrate and having none of the unsaturated carboxylic acid tensile stress reduction agents defined herein. This underlayer was overdeposited with 125 microinches of the electroless nickel-boron barrier layer of Coupon A, followed by a thin deposit of 3 to 5 microinches of electrolytically deposited 23-karat gold.

Coupons ADL were the same as Coupons AJ, except they had an electroless underlayer of 225 microinches of an electroless nickel-phosphorus deposit having a phosphorus content of about 11.5 percent that was laid down from a bath including about 36 gm/l of a combination of citric acid and malic acid complexing agents, 36 gm/l sodium hypophosphite, 10 gm/l of a blend of saturated alkyl dicarboxylic acid buffers, 5 gm/l of aconitic acid, and enough nickel salt to provide 6 gm/l; of nickel as nickel metal.

Coupons ADH were substantially the same as Coupons ADL, except the nickel-phosphorus deposit underlayer was about 500 microinches thick.

Coupons AbDH were substantially identical to Coupons ADH, except the nickel-boron barrier layer was deposited from a bath especially formulated to enhance the deposit of boron and provide a high boron barrier layer.

Coupons AH contained no underlayer and had an electroless nickel-boron barrier layer of about 500 microinches plated from the bath specified for Coupons AJ, followed by the 3 to 5 microinch thin gold film.

Coupons FDH were substantially the same as Coupons ADH, except the barrier layer was a 125 microinch layer of the electroless nickel-boron deposit of Coupon F.

Coupons DL had no underlayer, had a barrier layer of 225 microinches of the electroless nickel-phosphorus deposit of Coupons ADL, and had the 3 to 5 microinch thin gold overlayer.

Coupons DH were substantially identical to Coupons DL except the nickel-phosphorus deposit was about 500 microinches.

Coupons FZ had an underlayer of about 500 microinches of a sulfamate nickel deposit prepared by well-known procedures, had about 125 microinches of the barrier layer of Coupon FDH, and had the 3 to 5 microinch thin gold overlayer.

Coupons AZ were substantially the same as Coupons AJ, except the underlayer was about 500 microinches of sulfamate nickel.

Each of the coupons were solvent cleaned by immersion for 60 seconds in 60° C. isopropyl alcohol, followed by air drying for 10 minutes and storage in individual glass bottles. These coupons were subjected to environmental exposure conditions and to contact resistance testing as specified in Example I. Initial contact resistance values after cleaning and prior to environmental exposure are reported in Table 1 and in FIG. 11, the contact resistance values prior to cleaning also being shown in Table 1, wherein the sigma indicates the Standard Deviation and the "infinity sign" indicates that there was at least one reading greater than 10 ohms.

Environmental exposure data are shown as contact resistance distributions in FIG. 12, in which the "hash-marked" data arrow represents all other data at 48 hours, from which it can be seen that Coupons DL and DH performed best under these highly corrosive conditions and with the unshielded, unusually vulnerable conditions incident to a coupon study. This performance also far surpasses that which is typically found for a 50 microinch thick gold coating over sulfamate nickel.

EXAMPLE III

Shaped contacts were prepared by plating 16-pin, double sided, 100-gram edge card connectors, these connectors being used for parallel degradation studies on mated connector interfaces. The cantilevered springs or clips of these types of assemblies were made of phosphor-bronze that is essentially a copper-tin alloy. The contacts had a gold surface finish of 1 microinch CLA (center line average), and no further finishing was carried out prior to plating. The panels from which simulated printed circuit boards were sheared were of oxygen free high conductivity copper that were finished by mechanical polishing to approximately 10 microinches CLA.

These shaped contact connectors were plated in the same manner as the coupons of Example II in order to prepare connectors having the contact materials specified in Example II; thus there were prepared Connectors AJ, ADL, ADH, AbDH, AH, FDH, DL, DH, FZ and AZ. Each connector was mated once and remained

TABLE 1

| Coupon Mat'l. | As Received | | | | Cleaned | | | |
| --- | --- | --- | --- | --- | --- | --- | --- | --- |
| | 25 g | | 100 g | | 25 g | | 100 g | |
| | $R_c$ (milli-ohms) | $\sigma$ | $R_c$ (milli-ohms) | $\sigma$ | $R_c$ (milli-ohms) | $\sigma$ | $R_c$ (milli-ohms) | $\sigma$ |
| AJ | 15.40 | 6.33 | 4.82 | 0.57 | 9.07 | 4.19 | 3.71 | 0.44 |
| ADL | 12.50 | 7.57 | 3.85 | 0.53 | 9.49 | 2.00 | 3.79 | 0.37 |
| ADH | 12.20 | 3.72 | 4.73 | 0.51 | 10.80 | 3.16 | 4.33 | 0.48 |
| AbDH | ∞ | — | ∞ | — | 11.00 | 3.45 | 4.37 | 0.74 |
| AH | 9.37 | 3.47 | 3.39 | 0.51 | 8.24 | 2.81 | 3.29 | 0.38 |
| FDH | ∞ | — | 3.24 | 0.54 | 5.10 | 0.98 | 2.24 | 0.35 |
| DL | ∞ | — | 4.61 | 1.53 | 8.48 | 2.02 | 3.62 | 0.30 |
| DH | 12.90 | 5.10 | 5.02 | 0.71 | 11.10 | 3.11 | 4.26 | 0.58 |
| FZ | 3.89 | 3.09 | 1.70 | 0.20 | 3.19 | 0.76 | 1.66 | 0.19 |
| AZ | 9.13 | 16.20 | 2.34 | 0.26 | 5.87 | 1.10 | 2.29 | 0.24 |

The data have been computed as means and with standard deviations for purposes of illustration, even though in many cases the resistance distributions were not normal. The 25-gram, as-received data clearly show evidence of severe contamination of some samples. This contamination was not totally overcome, even at 100 grams. Solvent cleaning did provide a somewhat more uniform surface on which measurements could be made. However, reference to FIG. 11 shows that the data in many cases did not follow the expected log normal distribution characteristic of a nominally clean surface. Specifically, the high resistance "tails" were indicative of residual contamination, even after this cleaning operation. At 100 grams, this contamination was essentially overcome and the distributions were log normal.

mated throughout environmental exposure conditions as described in Example I. At the end of the exposure period, and after the final measurements, the interfaces were disturbed once and remeasured, the disturbance being one cycle of withdrawal and insertion of the board. Contact resistance measurements and standard deviations are reported in Table 2 prior to environmental exposure testing, during the 20-day exposure testing, and after interface disturbance at the completion of the exposure testing. The actual contact resistance measurements were made by reading the resistance across the edge card connectors under dry circuit conditions of 50 millivolts open circuit voltage and 10 milliamps of current.

TABLE 2

| Connector Material | Initial Rc (milliohms) | σ | 5 days Rc (milliohms) | σ | 10 days Rc (milliohms) | σ | 15 days Rc (milliohms) | σ | 20 days Rc (milliohms) | σ | Disturbed After 20 days Rc (milliohms) | σ |
|---|---|---|---|---|---|---|---|---|---|---|---|---|
| AJ | 8.04 | 1.01 | 9.13 | 1.34 | 8.37 | 1.22 | 11.00 | 2.59 | 9.77 | 2.07 | 11.80 | 3.65 |
| ADL | 11.60 | 4.13 | 1262.00 | 3530.00 | 11.60 | 4.21 | 17.40 | 13.20 | 38.30 | 47.30 | 16.30 | 7.64 |
| ADH | 12.30 | 5.26 | 12.80 | 7.73 | 14.20 | 4.38 | 13.50 | 4.82 | 14.50 | 6.68 | 54.20 | 71.40 |
| AbDH | 12.00 | 4.39 | 12.20 | 3.23 | 11.00 | 2.24 | 13.00 | 3.22 | 12.40 | 2.53 | 14.90 | 4.91 |
| AH | 16.00 | 4.80 | 15.00 | 3.82 | 14.90 | 3.04 | 13.60 | 2.71 | 13.50 | 3.49 | 18.40 | 8.14 |
| FDH | 10.20 | 4.48 | 10.20 | 3.19 | 8.16 | 1.61 | 7.58 | 1.39 | 7.88 | 1.13 | 31.60 | 45.50 |
| DL | 8.88 | 3.84 | 8.71 | 2.69 | 9.38 | 4.55 | 10.90 | 3.27 | 9.71 | 3.40 | 12.90 | 7.84 |
| DH | 14.70 | 4.44 | 15.10 | 4.01 | 16.20 | 3.99 | 15.10 | 3.56 | 14.80 | 4.68 | 20.00 | 5.62 |
| FZ | 1.73 | 0.38 | 5.91 | 10.70 | 2.51 | 0.74 | 2.74 | 0.80 | 2.35 | 0.76 | 11.60 | 14.30 |
| AZ | 5.47 | 3.32 | 540.00 | 1467.00 | 6.10 | 2.91 | 13.20 | 7.45 | 139.00 | 115.00 | 43.30 | 22.30 |

The Table 2 data show rates of degradation far slower than those observed by the coupons of Example II, which illustrates the significant affect of the shielding provided by the connector housing in reducing corrosion rates and emphasizes the severity of coupon studies. An important indicator of the contact resistance properties of this connector data is the magnitude of contact resistance change ($\Delta R/R$), since a slightly high contact resistance can be tolerated in some applications provided that the contact resistance does not fluctuate greatly over time.

The contact resistance stability of these connectors compare favorably with the contact resistance stability exhibited by edge card connectors of the same style and size as the edge card connectors of this Example but having a thick gold contact material of 50 microinches of gold over sulfamate nickel over copper. Such thick gold edge card connectors have a typical initial contact resistance of between about 3 and about 4 milliohms; after environmental exposure testing for 20 days under the same conditions reflected in Table 2, their typical contact resistance is between about 23 and about 80 milliohms. This represents a typical contact resistance change for a thick gold edge card connector of between about 20 and about 76 milliohms. Contact resistance change values calculated from the data of Table 2 are significantly less than 20 milliohms for Connectors AJ, AbDH, AH, FDH, DL, DH and FZ. Connectors FDH and FZ suffer from the fact that their contact resistance values increased four-fold and five-fold, respectively, after disturbance.

While in the foregoing specification certain embodiments and examples of this invention have been described in detail, it will be apparent that modifications and variations therefrom will be apparent to those skilled in this art in that this invention is to be limited only by the scope of the appended claims.

I claim:

1. An electrical contact material comprising, in combination: an electrically conductive basis metal layer, an electroless nickel barrier layer deposit over the basis metal layer, and a thin overlayer laid down onto said electroless nickel barrier layer, the thin overlayer being a layer of up to about 10 microinches of a precious metal deposit, said combination electrical contact material having contact resistance properties substantially the same as other electrical contact materials having a thick gold overlayer that is significantly thicker than 10 microinches, wherein said barrier layer deposit is an electroless nickel deposit selected from the group consisting of a nickel-boron deposit from an electroless bath including a boron deposition enhancer haing zirconyl or vanadyl ions and a nickel-phosphorus deposit from an electroless bath including an unsaturated carboxylic acid tensile stress reduction agent.

2. The electrical contact material of claim 1, wherein said barrier layer deposit is homogeneous.

3. The electrical contact material of claim 1, wherein said basis metal layer is a non-noble electrical conductor.

4. The electrical contact material of claim 1, wherein said basis metal layer is a copper deposit of up to about 800 microinches.

5. The electrical contact material of claim 1, wherein said precious metal thin overlayer is a flash deposit of gold.

6. The electrical contact material of claim 1, wherein said precious metal thin overlayer is a gold deposit of up to about 5 microinches.

7. The electrical contact material of claim 1, wherein said barrier layer electroless nickel deposit is a nickel-boron deposit from a bath including a zirconyl or a vanadyl compound, a borane reducing agent, a nickel source, and a carboxylic acid complexing agent.

8. The electrical contact material of claim 1, wherein said barrier layer electroless nickel deposit is a nickel-boron deposit from an electroless bath including between about 0.0005 and about 0.5 mol per liter of bath of a zirconyl or a vanadyl compound.

9. The electrical contact material of claim 1, wherein said electroless nickel barrier layer is selected from the group consisting of a nickel-boron electroless deposit having a boron content of at least about 2 weight percent based on the total weight of the deposit and a nickel-phosphorus electroless deposit having a phosphorus content of at least 10 weight percent based on the total weight of the deposit.

10. The electrical contact material of claim 1, wherein said electroless nickel barrier layer has a deposit thickness of between about 25 and about 1000 microinches.

11. The electrical contact material of claim 1, further including an underlayer deposit between the basis metal layer and the overlayer of precious metal deposit.

12. The electrical contact material of claim 1, further including an underlayer deposit over the basis metal layer and under the electroless nickel barrier layer, said underlayer having a deposit thickness of between about 150 and about 600 microinches.

13. The electrical contact material of claim 1, further including an underlayer deposit over said basis metal layer, wherein the total deposit thickness of the underlayer and of the electroless nickel barrier layer is between about 175 and 1000 microinches.

14. The electrical contact material of claim 1, wherein the deposit thickness of the electroless nickel barrier layer is between about 25 and about 700 microinches.

15. The electrical contact material of claim 1, wherein said basis metal layer is a copper deposit of up to about 800 microinches, said electroless nickel barrier layer is a deposit of between about 50 and about 800 microinches, and said precious metal thin overlayer is a flash deposit of gold of up to about 5 microinches.

16. The electrical contact material of claim 15, further including an underlayer deposit over the copper deposit, said underlayer having a deposit thickness of between about 150 and about 600 microinches.

17. The electrical contact material of claim 1, wherein said barrier layer electroless nickel deposit is a nickel-phosphorus deposit from a bath including an unsaturated carboxylic acid stress reduction agent, a bath soluble reducing agent, and a bath soluble source of nickel, and wherein said nickel-phosphorus deposit is substantially sulfur-free.

18. The electrical contact material of claim 1, wherein said homogeneous electroless nickel barrier layer deposit is substantially sulfur-free.

19. A contact member of an electronic component, comprising, in combination:
a shaped substrate for providing electrical contact between mating portions of an electronic component, said contact member having a multilayered plating deposit thereon which imparts to said contact member electrical contact resistance properties substantially the same as other electrical contact materials having a thick gold overlayer that is significantly thicker than 10 microinches, wherein said multilayered plating deposit comprises, in combination:
a basis metal layer exhibiting excellent electrical conductivity;
an electroless nickel barrier layer deposit over the basis metal layer, wherein said barrier layer deposit is an electroless nickel deposit selected from the group consisting of a nickel-boron deposit from an electroless bath including a boron deposition enhancer having zirconyl or vanadyl ions and a nickel-phosphorus deposit from an electroless bath including an unsaturated carboxylic acid tensile stress reduction agent; and
a thin overlayer of up to about 10 microinches of a precious metal deposit, said thin overlayer having been laid down onto said electroless nickle barrier layer deposit.

20. The electrical component contact of claim 19, wherein said barrier layer deposit is homogeneous.

21. The electronic component contact of claim 19, wherein said barrier layer deposit is selected from the group consisting of a nickel-boron electroless deposit having a boron content of at least about 2 weight percent based on the total weight of the barrier layer deposit and a nickel-phosphorus content of at least about 10 weight percent based on the total weight of the deposit.

22. The electronic component contact of claim 19, wherein said basis metal layer is a copper deposit.

23. The electronic component contact of claim 19, wherein said precious metal thin overlayer is a flash deposit of gold.

24. The electronic component contact of claim 19, wherein said precious metal thin overlayer is a gold deposit of no greater than about 5 microinches.

25. The electronic component contact of claim 19, wherein said electroless nickel barrier layer has a deposit thickness of greater than about 25 microinches.

26. The electronic component contact of claim 19, further including an underlayer deposit between the basis metal layer and the overlayer of precious metal deposit.

27. The electronic component contact of claim 19, further including an underlayer deposit over the basis metal layer and under the electroless nickel barrier layer, said underlayer having a deposit thickness of between about 150 and about 600 microinches.

28. The electronic component contact of claim 19, further including an underlayer deposit over said basis metal layer, wherein the total deposit thickness of the underlayer and of the electroless nickel barrier layer is between about 175 and 1000 microinches.

29. The electronic component contact of claim 19, wherein the deposit thickness of the electroless nickel barrier layer is between about 25 and about 700 microinches.

30. The electronic component contact of claim 19, wherein said basis metal layer is a copper deposit of up to about 800 microinches, said electroless nickel barrier layer is a deposit of between about 50 and about 800 microinches, and said precious metal thin overlayer is a flash deposit of gold of up to about 5 microinches.

31. The electronic component contact of claim 30, further including an underlayer deposit over the copper deposit, said underlayer having a deposit thickness of between about 150 and about 600 microinches.

32. The electronic component contact of claim 19, wherein said homogeneous electroless nickel barrier layer deposit is substantially sulfur-free.

33. The electronic component contact of claim 19, wherein the electrical contact resistance property of said contact is on the order of about 10 milliohms according to ASTM test procedure B-667-80.

34. The electronic component contact of claim 19, wherein the electrical contact resistance property of said contact is on the order of about 10 milliohms, and said contact resistance remains substantially constant over extended time periods and under harsh environmental conditions.

35. A contact material produced by a process comprising:
immersing a shaped electrical contact substrate into a bath and laying down a non-noble metal basis metal layer onto the shaped contact substrate;
depositing an intermediate barrier layer onto the basis metal deposited shaped contact substrate, said intermediate barrier layer depositing step including immersing the basis metal deposited shaped contact substrate into an electroless nickel bath selected from the group consisting of a nickel-boron depositing bath including a boron deposition enhancer having zirconyl or vanadyl ions and a nickel-phosphorus depositing bath including an unsaturated carboxylic acid tensile stress reduction agent;
immersing said intermediate barrier layer deposited, shaped contact substrate into the bath for laying down a precious metal deposit; and
controlling the precious metal deposition in order to lay down a thin overlayer of precious metal deposit, said controlling step limiting the thin overlayer deposit to not more than about 10 microinches of precious metal.

36. The contact material of claim 35, wherein said electroless nickel bath is maintained at a pH of between about 4 and about 10.

37. The contact material of claim 35, further including immersing said basis metal deposited shaped contact substrate into a bath for laying down an underlayer deposit prior to said step of depositing the intermediate barrier layer.

38. A process for producing electrical contact materials, comprising:

immersing a shaped electrical contact substrate into a bath and laying down a non-noble metal basis metal layer onto the shaped contact substrate;

depositing an intermediate barrier layer onto the basis metal deposited shaped contact substrate, said intermediate barrier layer depositing step including immersing the basis metal deposited shaped contact substrate into an electroless nickel bath selected from the group consisting of a nickel-boron depositing bath including a boron deposition enhancer having zirconyl or vanadyl ions and a nickel-phosphorus depositing bath including an unsaturated carboxylic acid tensile stress reduction agent;

immersing said intermediate barrier layer deposited shaped contact substrate into a bath for laying down a precious metal deposit; and controlling the precious metal deposition in order to lay down a thin overlayer of precious metal deposit, said controlling step limiting the thin overlayer deposit to not more than about 10 microinches of precious metal.

39. The process of claim 38, wherein said electroless nickel bath is maintained at a pH of between about 4 and about 10.

40. The process of claim 38, further including immersing said basis metal deposited shaped contact substrate into a bath for laying down an underlayer deposit prior to said step of depositing the intermediate barrier layer.

41. The process of claim 38, wherein said process limits the electrical contact resistance of the electrical contact materials produced thereby to about 10 milliohms according to ASTM test procedure B-667-80.

* * * * *

UNITED STATES PATENT AND TRADEMARK OFFICE
CERTIFICATE OF CORRECTION

PATENT NO. : 4,503,131
DATED : March 5, 1985
INVENTOR(S) : Donald W. Baudrand

It is certified that error appears in the above-identified patent and that said Letters Patent are hereby corrected as shown below:

```
Column 5,  line 61, "whererin" should read --wherein--.
Column 10, line 15, "content"  should read --contact--.
Column 17, line 67, "haing"    should read --having--.
Column 19, line 52, "nickle"   should read --nickel--.
```

Signed and Sealed this

Third Day of December 1985

[SEAL]

Attest:

DONALD J. QUIGG

Attesting Officer

Commissioner of Patents and Trademarks